United States Patent [19]

Sutherland et al.

[11] Patent Number: 4,700,174

[45] Date of Patent: Oct. 13, 1987

[54] ANALOG SIGNAL PROCESSOR

[75] Inventors: James F. Sutherland, Plum Borough; Albert W. Crew, Pittsburgh; Thomas J. Kenny, Plum Borough, all of Pa.

[73] Assignee: Westinghouse Electric Corp., Pittsburgh, Pa.

[21] Appl. No.: 862,335

[22] Filed: May 12, 1986

[51] Int. Cl.$^{4}$ .............................................. H03M 1/10

[52] U.S. Cl. ............................ 340/347 CC; 364/571; 376/259

[58] Field of Search ................. 340/347 CC; 376/245, 376/259; 364/571, 724; 371/25

[56] References Cited

U.S. PATENT DOCUMENTS

| | | | |
|---|---|---|---|
| 3,027,079 | 3/1962 | Fletcher | 340/347 CC |
| 4,494,183 | 1/1985 | Bayer | 364/571 |
| 4,545,026 | 10/1985 | Baggett | 340/347 CC |

*Primary Examiner*—Charles D. Miller
*Attorney, Agent, or Firm*—Daniel C. Abeles

[57] ABSTRACT

Apparatus and a method for use therein are disclosed for an analog signal processor, particularly one suited for use in nuclear power plant applications, which converts analog process signals to digital form and employs continuous on-line automatic calibration in order to accurately compensate for gain and bias errors occurring in its input analog circuitry.

27 Claims, 15 Drawing Figures

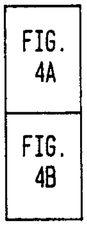
FIG. 4
READ & FILTER PROCESS SIGNAL ROUTINE 330
FIG. 4A
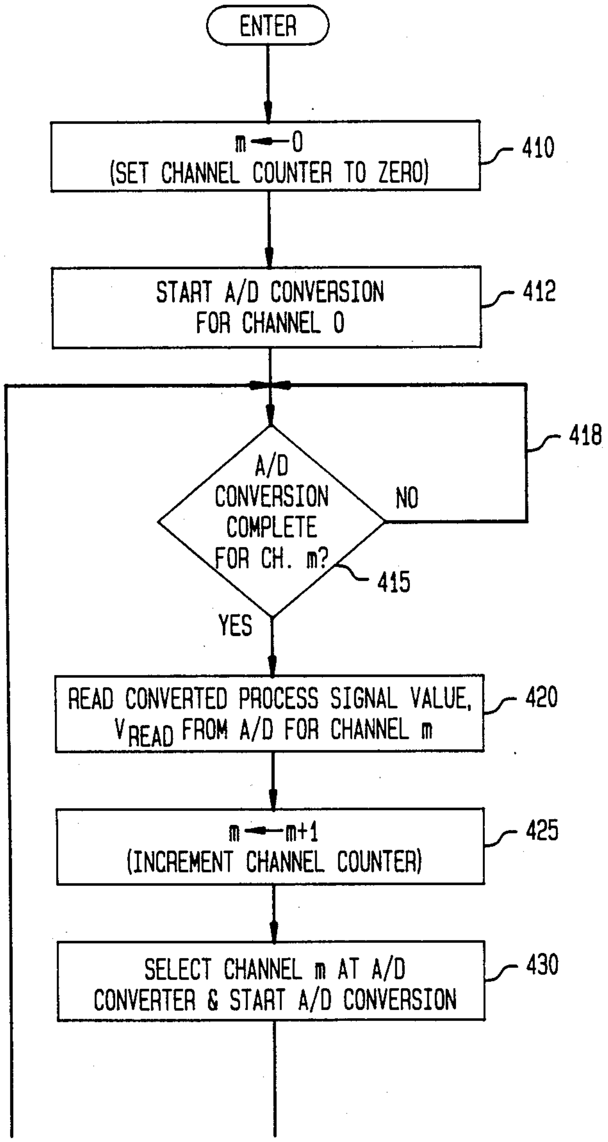

ANALOG SIGNAL PROCESSOR

BACKGROUND OF THE INVENTION

1. Field of the Invention

This invention relates to an analog signal processor; and more specifically such a processor, particularly suitable for use in nuclear power plant applications, which converts analog process signals to digital form and employs continuous on-line automatic calibration in order to accurately compensate for gain and bias errors occurring in its input analog circuitry.

2. Description of the Prior Art

In real-time process control systems, a set of analog process signals usually represents corresponding process variables. Each signal emanates from an associated process transducer and is applied as an input to a process controller. Depending upon the particular transducer, the analog process signal can be either an analog voltage of an analog current. A commonly used analog voltage range is 0–10 volts, and a commonly used analog current range is 4–20 milliamperes. Process transducers are usually field-mounted process transmitters, such as pressure sensors, or detectors, such as resistance temperature detectors (RTDs). The process controller continually monitors each analog process signal to determine the actual value of each corresponding process variable. Once the value of each process variable has been ascertained, the controller generates necessary process control signals in order to provide a desired function, i.e. controlling the process in a pre-defined manner or activating an alarm if any analog process signal exceeds a certain set limit value. Most process controllers convert the analog process signals into digital form by a suitable analog-to-digital (A/D) converter for subsequent processing by a digital computer, frequently a microprocessor.

Generally, many controlled electromechanical processes, such as those that frequently occur in a nuclear power plant, change rather slowly. As such, the analog process signals in these processes only contain low frequency components, for example, with a maximum frequency component of less than 10 Hz and frequently less than 1 Hz. However, these signals are often corrupted by low frequency noise, such as induced power line hum and harmonics of the power line frequency. To achieve accurate control, the process controller must first remove this noise from each process signal. This function, as well as the analog-to-digital conversion of the analog process signal, is provided by an analog signal processor that is connected to each incoming analog process signal.

In the past, an active (analog) filter was employed in the analog signal processor in order to remove noise appearing in each incoming analog process signal. Unfortunately, the active circuitry present in these filters introduced undersirable long-term gain and bias (offset) errors resulting from component aging, environmental changes and other factors. This, in turn, limited the stability of these filters and, hence, the accuracy of the filtered analog process signals. Since these filters were positioned ahead of the A/D converter, the converted analog signal often differed, as a result of these errors, by several counts from the true digital equivalent of the analog process signal. Active filters disadvantageously required frequent re-calibration to maintain these differences within an acceptable level.

Circuitry was often included within the analog signal processor to automatically perform this calibration on a regular basis and thereby compensate for the gain and bias errors. Calibration entails disconnecting the analog process signal from its corresponding input terminal and substituting a fixed reference voltage as the analog input signal to the controller and, either manually or automatically, adjusting programmed gain and bias compensation constants in order to produce a desired output signal. Once the reference signal was applied as input to the active filter, no readings of this signal could be taken for a period of time in order to enable the output of the filter to fully stabilize. This time period usually extended to least eight filter time constants for 99.99% accuracy. Inasmuch as the active filters possessed a slow response, often as long as approximately 100 milliseconds for the half step response time, the A/D converter could not sample the reference signal applied to a filter input until at least 800 milliseconds have elapsed. Unfortunately, for certain types of processes, such as monitoring the status of nuclear power plants, analog process signals could not be disconnected from the process controller for more than a short pre-defined time interval, usually no more than 100 milliseconds (1/10 second). Therefore, in these situations, the active filters could not be totally calibrated until required monthly tests are performed during which the process signals could be disconnected from the inputs to these filters for an extended period of time.

As such, the design of analog input circuits for process controllers for nuclear power plant applications frequency relegated the active filter to a position outside an automatic gain and bias calibration loop. In an attempt to minimize gain and bias errors occurring between successive re-calibrations, these filters were implemented using highly stable components. Unfortunately, such components were quite expensive and often failed to maintain these gain and bias errors within an acceptable range.

These analog input circuits possessed other drawbacks as well. First, certain operational failures could not be readily detected. Specifically, an analog multiplexer, located within the analog signal processor but under the control of the microprocessor situated within the process controller, selectively applied either the filtered analog process signal or one of two reference signals as input to the A/D converter. This allowed the process controller to repetitively inject each reference signal into the input of each analog input circuit and determine any conversion errors as being the difference between the true digitized value of the references, previously stored as constants, and the actual output values of the converter. Gain and bias correction algorithms were typically executed to compensate subsequently occurring process signals. In rare instances, the multiplexer used in these circuits failed in one position and was unable to apply the analog process signal in lieu of a reference signal as input to the A/D converter. Unfortunately, either of the reference signals could possess a value lying within the permissible range of the analog process signal. Consequently, when the multiplexer failed in this manner, the process controller would detect what it believed to be a steady normal value of the process signal, when, in fact, that reference signal was being applied instead. Hence, the controller was totally unaware of this failure and drove the controlled process toward an abnormal state.

Second, these analog input circuits could not be used with a wide variety of different RTDs without incurring significant expense. Specifically, an RTD, as noted above, is frequently used to measure a process temperature and, for that reason, is connected as an input transducer to the analog input circuit. Different RTDs are used to measure different temperature spans. These RTDs may all be one type, i.e. having the same temperature coefficient of resistivity, or a variety of types. As many as 25 different temperature spans may be measured in a typical control system for a nuclear power plant. With a constant current, generally 1 milliampere, flowing through every RTD in a system, each of these RTDs will produce a output voltage range dependent upon its type and the temperature span it is measuring. Hence, the voltage span produced by one RTD will not generally be the same as that produced by another. Consequently, a unique RTD input circuit must be used within the analog input circuit for each different temperature span and each different type of RTD, in order to appropriately scale the output of each amplified RTD signal to a uniform range, such as 0-5 volts. Unfortunately, this necessitates that a large variety of RTD input circuits, each with different components, be made available for use with the analog signal processor whenever RTDs are to be employed as input transducers. Circuits of this type generally utilize odd value precision resistors and unfortunately tend to be quite expensive.

Therefore, a need exists in the art for an analog signal processor, particularly one suitable for use in nuclear plant applications, which converts analog process signals to digital form and employs continuous on-line automatic calibration in order to accurately compensate for gain and bias errors. In addition, this processor should filter noise from each process signal and also fully detect operational failures in its input multiplexers and be capable of accepting a multitude of different RTDs as input without requiring a large number of specialized and expensive RTD input circuits.

SUMMARY OF THE INVENTION

The above-described deficiencies inherent in analog signal processors known in the art are advantageously eliminated in accordance with the principles of the present invention by an analog signal processor in which process noise is digitally filtered within the automatic gain and bias calibration loop.

In accordance with a specific embodiment described herein, the analog signal processor includes a number of analog input circuits connected to a microprocessor based signal processor which, in turn, is connected to a function processor. The analog filter is eliminated from each analog input circuit. In addition, the reference voltages are injected at essentially the input of each analog input circuit. Each analog input circuit provides an isolated analog output signal, which is either a corresponding measured process signal or one of several measured reference voltage, and is applied as an input to the signal processor. The signal processor samples and digitizes the analog signal produced by each analog input circuit to produce digital values, for both the corresponding measured analog process signal and the measured reference voltage, and then processes each of these digital values through a low pass, illustratively two pole, digital filter to remove process noise.

Furthermore, in accordance with the principles of the present invention, the function processor utilizes the filtered measured process values and the filtered measured reference voltage values, along with the expected values of the latter, associated with each analog input circuit to calculate correction coefficients for both the gain and bias errors produced by that circuit. Once these coefficients have been calculated, the function processor uses them to compensate each filtered measured process value to eliminate these errors. In particular, the function processor first calculates coefficients of a pre-defined model, illustratively linear, of each analog input circuit using the filtered measured reference voltages for that circuit. Once these coefficients have been obtained, the processor inverts the model and compensates each filtered measured process value obtained through this circuit using this model.

Moreover, eliminating the analog filter significantly shortens the overall response time of each analog input circuit and hence significantly reduces the amount of time a process signal needs to be disconnected from the function processor. This advantageously permits the signal processor to repetitively and automatically select between the analog process signal or a reference voltage, as the input to each analog input circuit, on an on-line basis. Consequently, the function processor is able to advantageously compensate the digitized process signal values on a sufficiently frequent basis to continuously maintain gain and bias errors at minimal values.

In accordance with a feature of the invention, one embodiment of the analog input circuit advantageously adapts itself to function with a wide variety of RTDs, of different type and/or output voltage range. This function is provided by incorporating, into the input circuit, an amplifier having a variable gain and variable output bias. The gain and output bias of the amplifier are set by the signal processor to approximately cancel any offset appearing in the actual output voltage of an RTD and also to approximately scale the RTD output voltage to an acceptable range for a desired temperature span to be measured.

BRIEF DESCRIPTION OF THE DRAWING

The principles of the present invention may be clearly understood by considering the following detailed description in conjunction with the accompanying drawing, in which.

Figures 3, 3A:
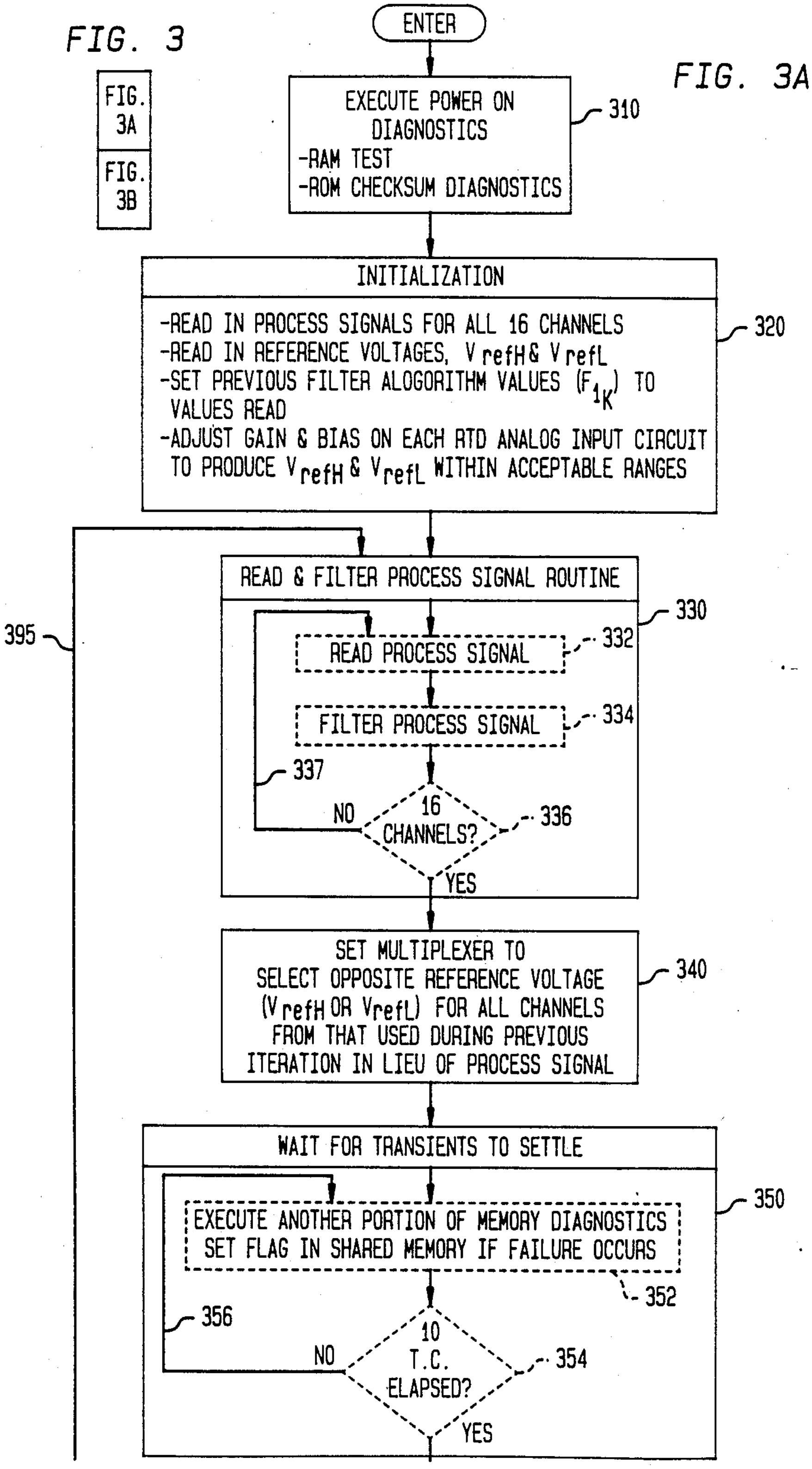

FIGS. *2a–2c* together show a block diagram of an analog signal processor incorporating the principles of the present invention;

FIG. 3 shows the proper alignment of the drawing sheets for FIGS. *3a* and *3b;*

FIGS. *3a* and *3b* together depict a flowchart of the software executed by signal processor 100 shown in FIGS. *2a–2c;*

FIG. 4 shows the proper alignment of the drawing sheets for FIGS. *4a* and *4b;*

FIGS. *4a* and *4b* together depict a flowchart of Read and Filter Process Signal Routine 330 shown in FIGS. *3a* and *3b;*

Figures 5, 5A:
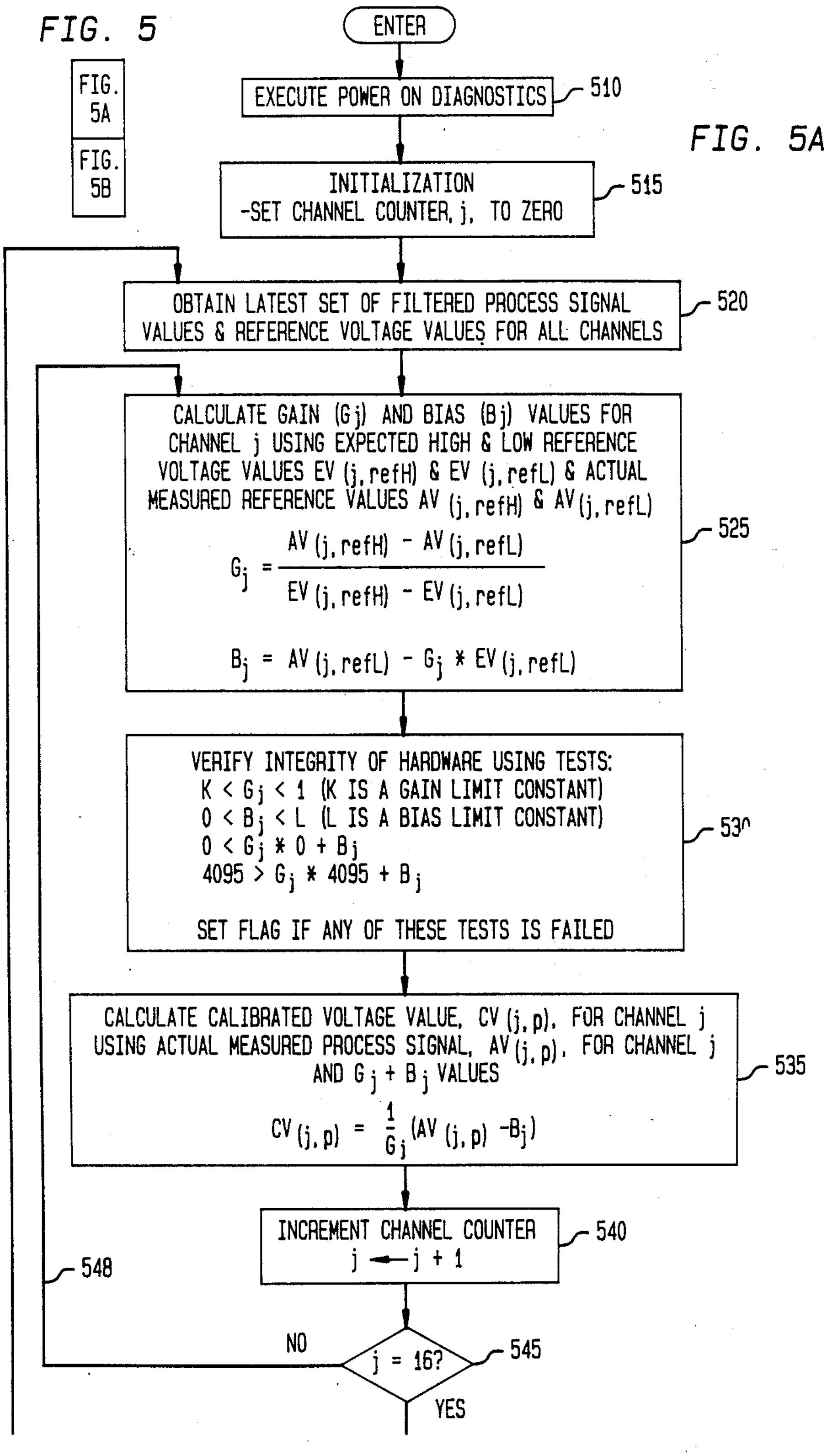

FIG. 5 shows the proper alignment of the drawing sheets for FIGS. *5a* and *5b;*

Figure 6:
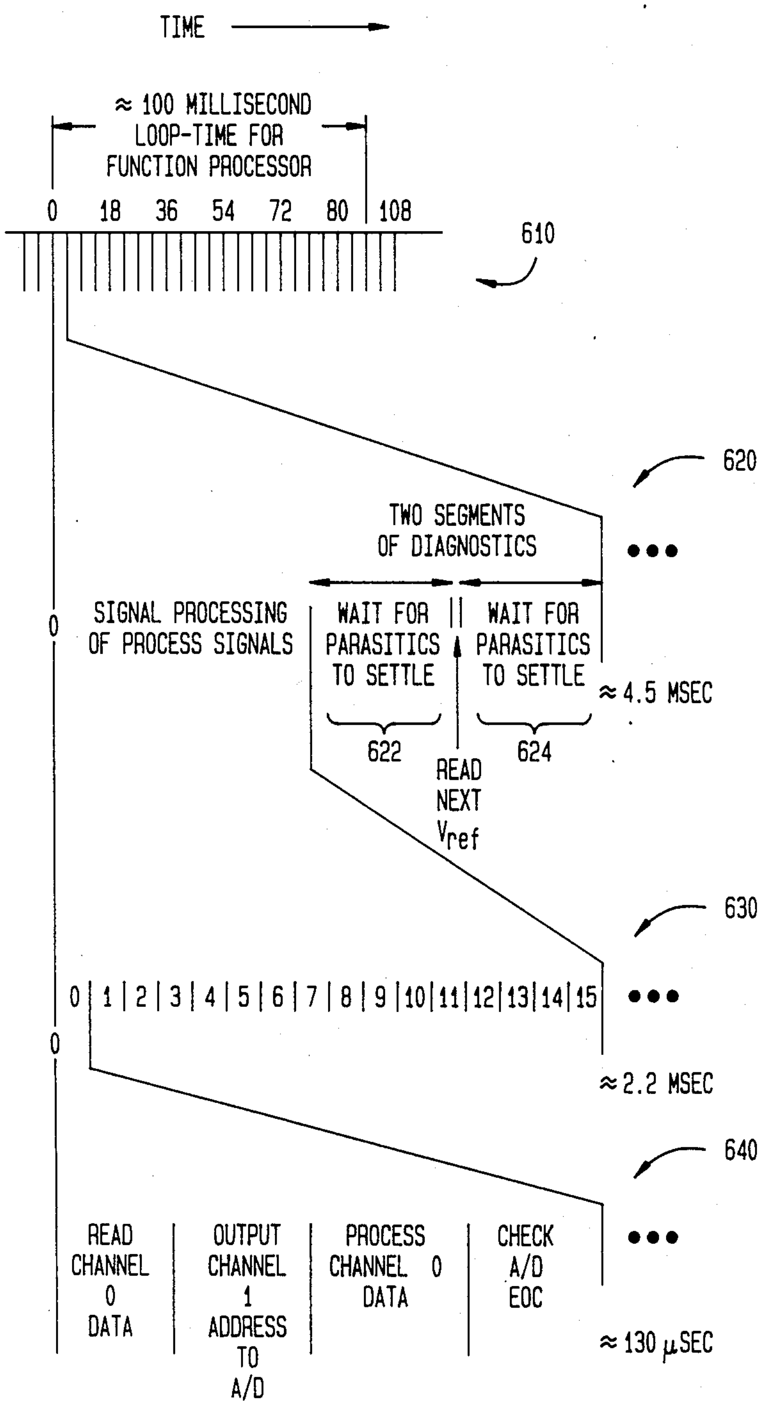

FIGS. *5a* and *5b* together depict flowchart of the software executed by function processor 210 shown in FIGS. *2a–2c*; and FIG. 6 is a timing diagram of the operations undertaken by the inventive system.

To facilitate easy understanding, identical reference numerals have been used to denote identical elements common to the figures.

DESCRIPTION OF THE PREFERRED EMBODIMENT

After reading the following description, those skilled in the art will clearly realize that teachings of the present invention can be utilized in a wide variety of systems for processing a wide variety of analog input signals. For purposes of illustration, the present invention will be discussed in terms of an analog signal processing system suitable for use in nuclear power plant applications.

In the context of the present invention, an analog signal processing system is one which accepts a number of separate process signals, and thereafter filters and digitizes each of these signals for use by subsequent process control elements, e.g. PID controllers and the like. To ensure that the analog signal processing system accurately performs these functions, circuitry is often incorporated into the system in order to calibrate its operation.

Figure 1:
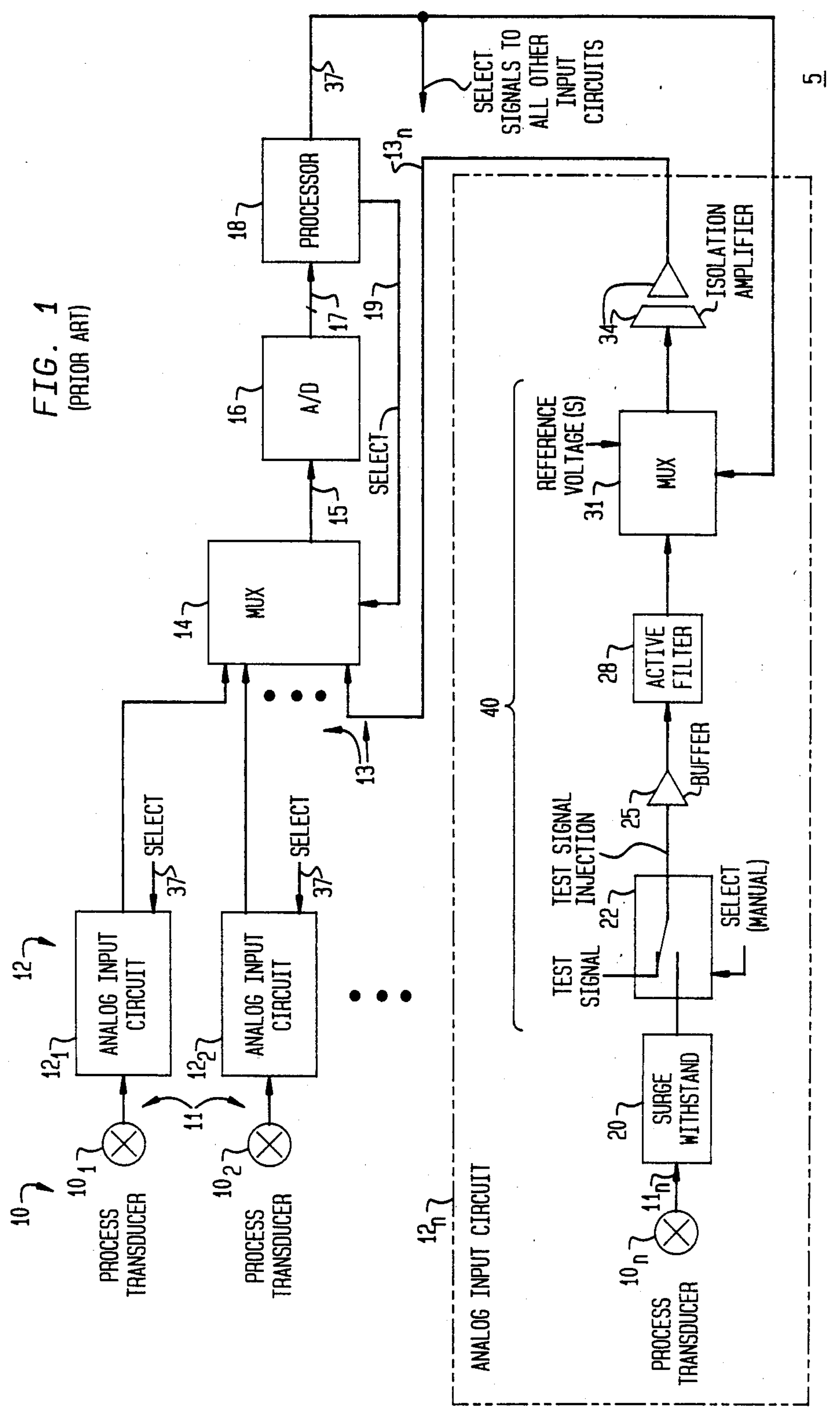
FIG. 1 (PRIOR ART)
FIG. 1 is a block diagram of an analog signal processor known in the art.

FIG. 1 shows a block diagram of one such analog signal processing system known in the art and designed for use in nuclear power plant applications. In particular, incoming analog process signals are generated by a number of process transducers 10 specifically consisting of transducers $\mathbf{10}_1$, $\mathbf{10}_2$, . . . , $\mathbf{10}_n$. These transducers are generally 4–20 milliampere (mA) process transmitters, each of which measures a process particular parameter such as a flow rate, a pressure or a fluid level. Each transducer is connected through a respective one of leads 11 to an input of a corresponding one of analog circuits 12. Each of these analog circuits, specifically circuit $\mathbf{12}_1$, $\mathbf{12}_2$, . . . , $\mathbf{12}_n$, provides various functions: surge protection, input noise filtering, signal selection for testing and calibration, and isolation. The output from each analog input circuit is an isolated analog voltage which is routed over leads 13 to a corresponding analog input on multiplexer 14. This multiplexer, in response to a digital address appearing on select leads 19 and generated by digital processor 18, selects one of these analog signals and routes this signal, via lead 15, to the analog input of analog-to-digital (A/D) converter 16. This converter samples this selected signal and provides an equivalent digital value, via leads 17, to digital processor 18. To calibrate the analog signal processing system, a stable pre-defined reference voltage is substituted for each incoming analog process signal. In some cases, two different reference voltages are successively substituted for each process signal. Thereafter, the response of the system to each reference signal is measured. Appropriate correction factors are then calculated by digital processor 18 based upon any differences occurring between the expected and measured performance of the system to each of these reference voltages. These correction factors are then used by processor 18 to compensate each subsequently digitized process signal. To provide this calibration function, digital processor 18 provides select signals on lead 37 which are routed to the multiplexer located within each analog input circuit. As specifically discussed in detail below in the context of analog input circuit $\mathbf{12}_n$, the select signals appearing on lead 37 causes each analog input circuit to disconnect the incoming analog process signal from its input and substitute the reference voltage therefor.

Inasmuch as all the analog input circuits are identical, only circuit $\mathbf{12}_n$ will be discussed in detail. This circuit contains surge withstand circuit 20, test injection circuit 22, buffer 25, active filter 28, multiplexer 31 and isolation amplifier 34. In operation, the process signal, generated by process transducer $\mathbf{10}_n$ and appearing on lead $\mathbf{11}_n$, is first applied as input to surge withstand circuit 20 that suppresses transients appearing in any of the process signals and thereby protects analog input circuit $\mathbf{12}_n$ from damage that would otherwise result from these transients. The output of the surge withstand circuit is applied to one analog input of test signal injection circuit 22. This circuit usually consists of a relay with the incoming process signal appearing on its normally closed contact. The other analog input to circuit 22, i.e. the normally open contact of this relay, is an externally generated test signal. An automatic test sequencer applies a suitable select signal to circuit 22 to select which of these two signals will be routed through this circuit. The output of circuit 22 is buffered by buffer 25 and, from there, applied as input to active filter 28. This filter, which removes process noise from the incoming analog signal prior to its application as input to isolation amplifier 34, is usually a 2–3 pole low pass Butterworth filter, with a 40 db or greater rolloff beginning at approximately 4 Hz. A stable fixed reference voltage is applied to another analog input to this multiplexer. A select signal, appearing on lead 37 and emanating from digital processor 18, determines which of these input signals will be passed through multiplexer 31. Under normal conditions, processor 18 instructs multiplexer 31 to pass filtered incoming analog process signals through to isolation amplifier 34 and from there to output lead $\mathbf{13}_n$. Alternatively, during calibration intervals, digital processor 18 instructs multiplexer 31 to pass one of the reference voltages instead. The signal appearing on lead $\mathbf{13}_n$ is thereafter routed to a corresponding analog input of multiplexer 14. Isolation amplifier 34 is well-known and employs transformer isolation to isolate both the analog process signal appearing at the output of multiplexer 34 and the DC power (not shown) that supplies a portion of the analog input circuit.

As noted, this prior art anlaog signal processor possesses two drawbacks. First, section 40 of each analog input circuit can not be calibrated sufficiently frequently to ensure that gain and bias errors do not appear in the converted process signal values fed to processor 18. Specifically, the test signal can not be applied, via test signal injection circuit 22, to processor 18 in lieu of the analog process signal for a sufficiently long period of time, during normal nuclear plant operation, to permit all transients occuring within active filter 28 to settle out. Consequently, calibration can only occur when required tests are performed, generally at one month intervals, during which the analog process signal could be disconnected from the analog input circuit for an extended period of time. Unfortunately, a one month interval is sufficiently long to permit gain and bias errors to appear within section 40. Second, certain failures occurring within multiplexer 31 can not be detected. Specifically, if the multiplexer failed while routing the reference signal to the processor, the processor would be unable to differentiate between the reference voltage and a steady normal value of the process signal. This occurs because the value of the reference voltage lies within the normal range of the process signal. Hence, the processor would tend to drive a controlled process toward an abnormal state.

These drawbacks are eliminated by the inventive analog signal processor in which the active low pass filter existing outside the calibration loop is eliminated in favor of using digital low pass filtering existing within the calibration loop which permits gain and bias errors to automatically compensate on a sufficient frequent automatic on-line basis to eliminate these errors from appearing in the converted process signal values. In addition, reference potentials are used that are outside of the permissible range of the input signal in order to detect multiplexer failures.

Figures 2, 2A:
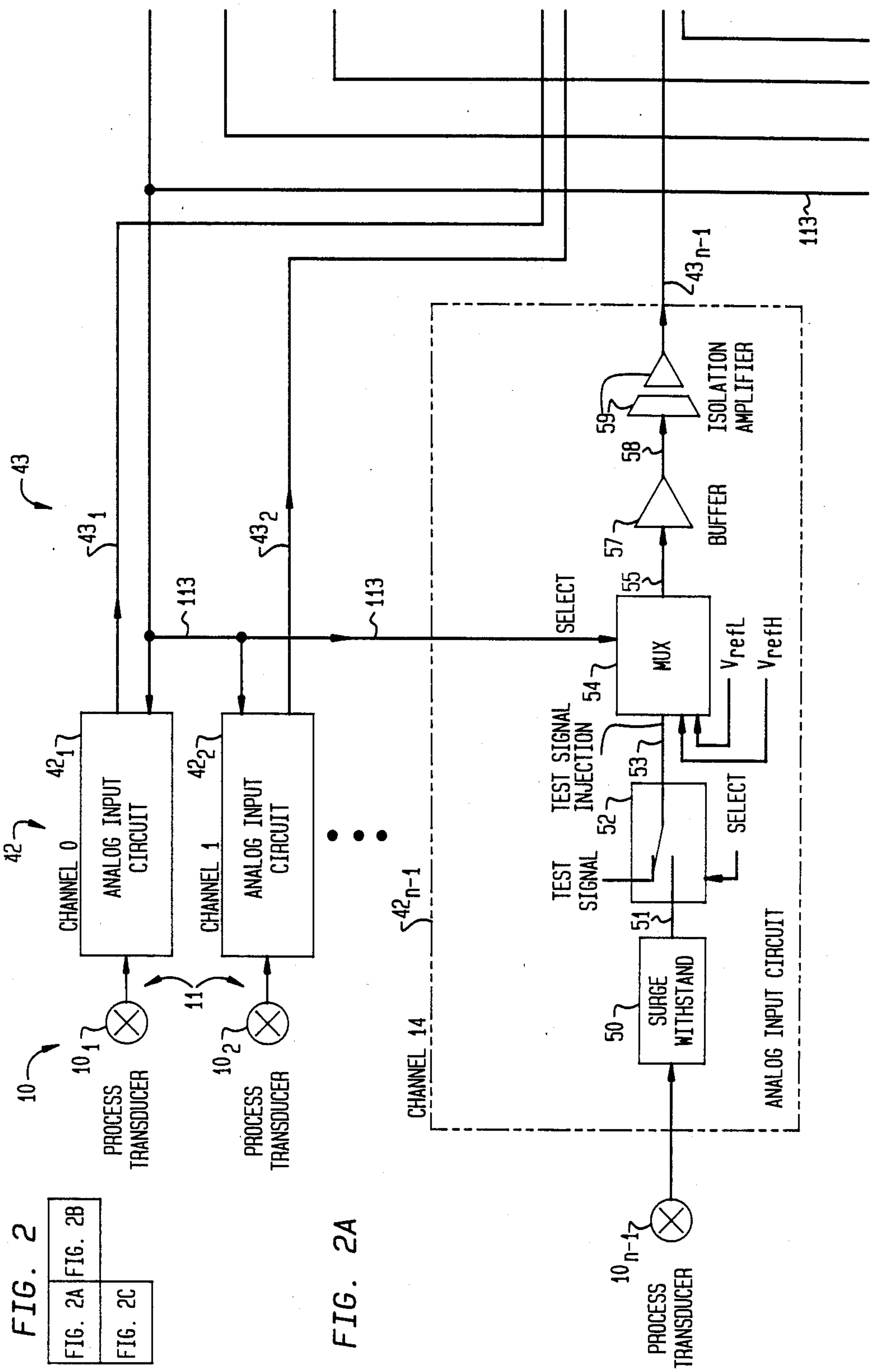
FIG. 2 shows the proper alignment of the drawing sheets for FIGS. *2a–2c;*

A block diagram of analog signal processor 8 constructed in accordance with the teachings of the present invention is depicted in FIGS. *2a–2c*, for which the proper alignment of the respective drawing sheets is shown in FIG. 2. As shown, the analog signal processor contains a number of identical analog input channels 42, specifically analog input circuits $\mathbf{42}_1$, $\mathbf{42}_2$, . . . , $\mathbf{42}_{n-1}$ that accepts 4–20 mA process transducers, signal processor 100, system bus 200 and function processor 210. This analog signal processor also includes analog input circuit $\mathbf{42}_n$ which accepts an RTD input, thereby providing 15 separate channels of analog inputs. Input circuit $\mathbf{42}_n$, as discussed in detail below, advantageously adapts itself to function with a wide multitude of RTDs, of different types and/or output voltage ranges.

In contrast to that shown in FIG. 1, process noise is not filtered using an active analog filter located within each analog input circuit but rather through digital filter algorithms executed within signal processor 100. By eliminating the analog filter from each analog input circuit, the reference voltage can be injected at an earlier point in the circuit, i.e. after the surge withstand, than in past designs, typified by that shown in FIG. 1. Moreover, eliminating the analog filter significantly shortens the overall response time of each analog input circuit such that each circuit can be automatically calibrated on-line and at a sufficiently frequent basis to continuously and advantageously maintain gain and bias errors at a minimal value.

Each input analog circuit depicted in FIG. 2 provides various functions: surge protection, manual test signal injection, selection of a reference voltage for calibration, and output isolation. The isolated analog voltage produced by each analog input circuit, whether it is a measured process signal, a measured test signal or a measured reference voltage, is filtered by signal processor 100. Function processor 210 uses the filtered measured reference signal values from each analog input circuit, as discussed in detail below, to calculate two coefficients in a pre-defined linear model of that analog input circuit. Once these coefficients have been obtained, the filtered measured process signals are compensated for gain and bias errors using the model. Thereafter, function processor 210 uses these compensated values for control purposes, such as input to a proportional-integral-derivative (PID) controller.

Specifically, illustrative analog input circuit $\mathbf{42}_{n-1}$ contains surge withstand 50, test signal injection circuit 52, multiplexer 54, buffer 57 and isolation amplifier 59. The process signal produced by process transducer $\mathbf{10}_{n-1}$ is applied to surge withstand 50 which suppresses surges appearing on the incoming signal. Thereafter, the process signal is applied, via lead 51, to one analog input of test signal injection circuit 52. This circuit is identical to test signal injection circuit 22 (see FIG. 1). Test signal injection circuit 52, shown in FIG. 2, is required by applicable regulations which specify that electronic circuitry, used for control of nuclear power plants, must be tested using externally applied test signals on a regular basis. Since the inventive system operates in an identical fashion if an incoming signal is either a process signal or an externally applied test signal, for purposes of brevity the following discussion will only address a process signal. Multiplexer 54 selects either the process signal, appearing on lead 53, or one of two reference voltages, $V_{refL}$ or $V_{refH}$, to lead 55. Suitable select signals produced by signal processor 100 and appearing on leads 113 determine which of these signals will be routed through the multiplexer. The magnitude of both reference voltages is advantageously outside the voltage range of the process signal. The value of reference voltage $V_{refH}$ is greater than the maximum value of the process signal, and the value of reference voltage $V_{refL}$ is lower than the minimum value of the process signal. For example, for a process signal range of 0.2 to 1.0 volts, the values of $V_{refL}$ and $V_{refH}$ may be approximately 0.18 volts and 1.02 volts, respectively. By using reference voltages outside the expected input range of 0.2 to 1.0 volts, any failure is multiplexer 54 can be readily detected. The output signal produced by multiplexer 54 is applied via lead 55 to buffer 57 which buffers this signal and drives isolation amplifier 59, via lead 58. This isolation amplifier functions, in an identical manner as isolation amplifier 34 shown in FIG. 1, to produce an isolated measured analog signal appearing on lead $\mathbf{43}_{n-1}$ of leads 43. The signal range on leads 43 is typically 0.9 to 4.1 volts after amplification by buffer 57 and isolation amplifier 59.

Each isolated measured analog signal appearing on leads 43 is routed to a different analog input of multiplexer 120 located within signal processor 100. This signal processor contains microprocessor 150, digital output circuit 110, multiplexer 120, A/D converter 130, random access (RAM) memory 160, read only (ROM) memory 170 and shared memory 180, all connected via bus 140. ROM memory 170 may be specifically implemented using programmable read only memory (PROM) circuits. Select signals appearing on leads 113 are provided by digital output circuit 110.

Under control of a program, as discussed in detail later in conjunction with FIGS. *3a* and *3b*, and *4a* and *4b*, stored within ROM 170, microprocessor 150 first applies appropriate instructions to digital output circuit 110 to provide suitable select signals on leads 113 to instruct the multiplexer located within each analog input circuit to select its process signal. Thereafter, the microprocessor issues appropriate instructions to multiplexer 120 to sequentially select each of its analog input signals and apply that signal to A/D converter 130. This converter samples each analog signal and converts the sample into digital form. After a conversion has been completed, the resulting digital value is temporarily stored within RAM 160. Thereafter, microprocessor 150 applies the address of the next measured analog signal to be converted, via bus 140, to multiplexer 120. During the time required for the A/D to perform the next conversion, this digital value that was stored in RAM 160 is filtered by a two pole digital low pass filter algorithm executed by the microprocessor. Once A/C converter 130 has finished the next conversion, this process of reading a digital value from the A/D converter into RAM, supplying the address for the next analog input to the A/D converter and filtering the most recent digital value stored within the RAM iteratively repeats. This pipelining of conversion and filtering advantageously increases the speed at which the analog signal processor operates.

After the values of all sixteen process signals have been digitized and filtered by signal processor 100, the signal processor applies suitable signals to select leads 113 to simultaneously select one of the reference signals, either $V_{refH}$ or $V_{refL}$, for all of the analog input circuits. The reference voltage selected is the one opposite to that which was most recently selected. After a reference voltage has been selected but before it is sampled and converted, the microprocessor waits a pre-defined interval of time such that all transients occurring in the isolation amplifier and elsewhere throughout the analog input circuit will have an adequate amount of time to settle out. This time interval is taken to be ten time constants of the isolation amplifier. Once this reference voltage has been digitized, the signal processor again selects all the process signals. It agains waits ten time constants for transients to settle before beginning sampling, digitization and filtering of any of the incoming process signals. During this subsequent time interval, microprocessor 150 transfers all these filtered values (both process signals and reference voltages) into shared memory 180. This memory is a two port or shared single port RAM accessible on a read/write basis by both the microprocesor and by function processor 210. To prevent data tearing from occurring within the shared memory, buffered data and well known semaphores are stored within this memory. These semaphores are appropriately tested and set by both the microprocessor and shared memory before any data is written into the shared memory.

The capacity of the analog signal processor can be advantageously increased in groups of sixteen, by adding additional signal processors 100, each handling sixteen process inputs, to bus 200 for connection to function processor 210.

As discussed above, analog input circuit $42_n$ is adapted to handle a wide variety of RTD inputs. This circuit substitutes variable gain/variable bias amplifier 67 for buffer 57 situated in illustrative analog input circuit $42_{n-1}$. In addition, integrators 71 and 74 are included within analog input circuit $42_n$ to apply respective analog control voltages to amplifier 67, via leads 72 and 75, in order to appropriately vary its gain and output bias. Each of these control voltages can be incrementally increased or decreased by applying a suitable pulse on respective increment and decrement leads for each integrator, specifically leads 73 for integrator 71 and leads 76 for integrator 74. These pulses are produced by digital output circuit 110 via suitable instructions from microprocessor 150. To ensure that the values of both reference voltages, $V_{refH}$ and $V_{refL}$, remain outside the voltage range produced by the RTD in use, the magnitude of each of these reference voltages is pre-selected and manually set on the analog input circuit for the particular RTD that is to be connected thereto. In particular, these reference voltages are produced by applying a precision reference voltage, generally 10.000 volts, produced by precision reference voltage supply 80 through a voltage divider consisting of resistors 81, 82 and 83. The magnitudes of reference voltages $V_{refH}$ and $V_{refL}$ are set by suitable selection of the respective values, $R_2$ and $R_1$, of resistors 82 and 83. Voltages $V_{refL}$ and $V_{refH}$ are applied through respective leads 84 and 85 to multiplexer 64. A similar circuit provides the reference voltages on each of the other analog input circuits. During calibration of analog input circuit $42_n$, the microprocessor applies suitable pulses to leads 76 to cause signal $43_n$ to lie within an acceptable range while each reference voltage $V_{refL}$ and $V_{refH}$ is selected by multiplexer 64. The minimum and maximum acceptable values for each of the ranges for reference voltages $V_{refL}$ and $V_{refH}$ are stored stored within a table in ROM 170. Specifically, when necessary, the microprocessor applies suitable pulses on leads 73 to provide an appropriately valued control voltage on lead 72 to force the $V_{refL}$ and $V_{refH}$ output signals appearing on leads $43_n$ to the same nominal reference voltage output ranges as that produced by all the other RTD analog input circuits, e.g. 0.4–0.6 for the $V_{refL}$ output signal and 4.4–4.6 volts for the $V_{refH}$ output signal. The output of amplifier 67 is applied, via isolation amplifier 69, to one input of multiplexer 120 located within signal processor 100. The scaled RTD voltages are filtered by signal processor 100 and are compensated for gain and bias errors by function processor 210 in the same manner as described above. The expected values of these reference voltages are also stored within function processor 210 for use in compensating the filtered (RTD) process signal, as discussed in detail hereinbelow.

Now, having discussed the hardware of the inventive analog signal processor in detail, the discussion will now shift to the software executed within both signal processor 100 and function processor 210.

Figure 3B:
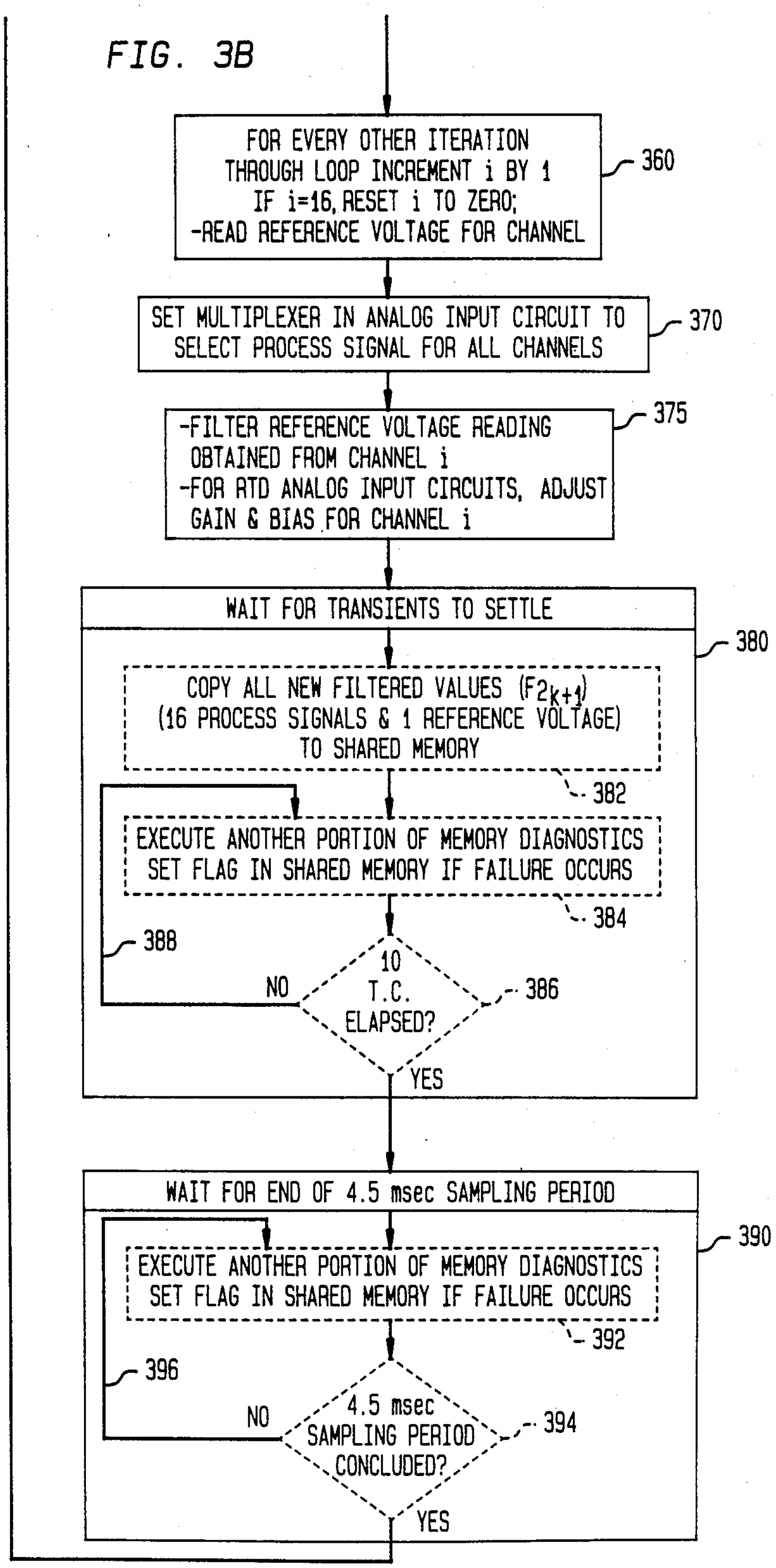

FIGS. 3*a* and 3*b*, for which the proper alignment of the respective drawing sheets is shown in FIG. 3, depicts a flowchart of the software executed within signal processor 100. To fully understand the operations shown in this flowchart, the reader should simultaneously refer to FIG. 6 which provides a timing diagram of these operations.

Specifically, after signal processor 100 has been powered up, control passes to block 310. Here, various well-known power on diagnostics, such as a RAM test and ROM checksum diagnostics, are executed. After these diagnostics have been completed, execution proceeds to block 320 which performs initialization. Since the digital filter algorithms, as discussed below in conjunction with FIGS. 4*a* and 4*b*, utilize past values of the filtered measured analog signals, all these values must be set to an initial value. To eliminate start-up transients in the control process, block 320 causes the process signals for all sixteen inputs and both calibration voltages, $V_{refH}$ and $V_{refL}$, for each analog input circuit to be sequentially selected, digitized and stored in RAM memory. These values are then used as the past filtered values for the digital filter algorithms. In addition, once the initial reference voltage values produced by each RTD analog input circuit have been obtained, the gain and bias of that input circuit are also initially adjusted, in the manner set forth in detail below, to bring subseqently generated reference voltages produced by all the RTD analog input circuits into corresponding acceptable ranges.

Once the initialization process has been completed, control passed to block 330. This block, when executed sequentially reads the process signal produced by each channel in block 322, filters that reading in block 334 and iterates through decision block 336 for all sixteen process signals. As shown in FIG. 6, these operations, denoted by numeral 630, consume approximately 2.2 milliseconds. The specific reading and filtering processes, denoted by numeral 640, executed for each process signal will be discussed below in conjunction with FIGS. 4*a* and 4*b*. After these operations have been completed, control passes to block 340. Here, the microprocessor instructs the multiplexer in each analog input circuit to select one of the reference voltages, $V_{refH}$ or $V_{refL}$, in lieu of the process signal as input. The selection of $V_{refH}$ or $V_{refL}$ alternates on every iteration through block 340. Since, the input to the isolation amplifier in each analog input circuit has a relatively long time constant, its output voltage may contain transient voltages and hence adequate settling time mut be afforded to allow these transient voltages to settle before reading the voltage appearing at its output. In addition, other transient voltages, though of relatively short duration, occur in each analog input circuit due to the capacitance of leads and other components. Therefore, to furnish the necessary time for all these transient voltages to settle, execution proceeds to block 350. Here, the microprocessor waits until an interval of time, approximately equivalent to ten time constants of the isolation amplifier and indicated by time period 622 shown in FIG. 6, has elapsed. Until this interval has fully elapsed, execution proceeds, as shown in FIGS. 3*a* and 3*b*, via the "NO" path from decision block 354 to block 352 in order to take advantage of this processing time. Block 352 executes a portion of diagnostics for the memory located within the signal processor. If a failure is detected, the microprocessor sets an appropriate flag in the shared memory which, is subsequently sensed by the function processor to provide an indication to an operator.

Once this interval has fully elapsed, execution passes, via the "YES" path from decision block 354 to block 360. Execution of this block increments counter, i, by one on every other loop iteration, and samples and digitizes the selected reference voltage for channel i. Thirty two iterations through blocks 340, 350 and 360 are required to read (sample and digitize) both reference voltages for every one of the sixteen input channels. Thereafter, block 370 is executed to instruct each multiplexer in every channel (analog input circuit) to select the process signal. Once this occurs, block 375 is executed to first filter the reference voltage reading obtained for channel i and then, if this channel is an RTD analog input circuit, to appropriately correct the gain and bias for this channel. In particular, the actual filtered reference voltages produced by this channel are compared against expected values for these voltages. The differences are used to determine the width of a pulse, applied over lead 73 or 76 (see FIGS. 2*a*–2*c*) as discussed previously, to appropriately vary the gain and bias associated with that RTD analog input circuit in order to ensure that the reference voltages subsequently produced by that channel lie within the appropriate ranges: 0.4–0.6 volts for $V_{refL}$ and 4.4–4.6 volts for $V_{refH}$. The pulse width is proportional to the corresponding voltage difference. To maintain stability, the magnitude of any gain and bias correction, either an increase or a decrease, is kept small. Generally, the gain is adjusted to ensure that the magnitude of voltage $V_{refH}$ produced by channel i remains within its corresponding range, and the bias is adjusted to ensure that the magnitude of voltage $V_{refL}$ produced by this channel remains within its corresponding range. Although block 375 is shown as being executed prior to block 380, block 375 can be re-positioned to take advantage of idle processing time that might otherwise occur within block 380—which will be discussed below. Specifically, block 375 may be executed within block 380 and prior to the execution of block 382.

As before, suitable time must be afforded, again approximately ten time constants, for all transient voltages to settle prior to commencing sampling and digitizing of the process signals. Therefore, execution proceeds to block 380. Upon entry into this block, all the newly filtered measured values for each channel (process signal and reference voltage) are transferred to shared memory 180 (see FIGS. 2*a*–2*c*) for subsequent use by function processor 210. After this occurs, execution proceeds to block 384 which iteratively executes portions of memory diagnostics, via "NO" path 388 from decision block 386, until a time interval equivalent to ten time constants has elapsed. The time interval consumed by execution of block 380 is shown as interval 624 in FIG. 6. Once execution of block 380 has been completed, control passes to block 390. Every process signal is sampled at a pre-defined 222 Hz sampling frequency which sets the execution time for one iteration through the program shown in FIGS. 4*a* and 4*b*, i.e. the width of the entire segment indicated by numeral 620 in FIG. 6, at approximately 4.5 milliseconds (msec). Execution of block 390 ensures that a 4.5 millisecond sampling period fully elapses. Anti-aliasing for this sampling, by signal processor 100 (see FIGS. 2*a*–2*c*), is provided by low pass filtering provided by circuit components located in each surge withstand. In the event this 4.5 millisecond sampling period has not completely elapsed when execution passes to block 390, then block 392, as shown in FIGS. 3*a* and 3*b*, is executed and if necessary, iteratively executed via "NO" path 396 from decision block 394, to perform additional portions of the memory diagnostics. At the completion of the 4.5 millisecond sampling period, control passes via "YES" path 395 to block 330 to iteratively repeat the entire sampling process.

Figure 4B:
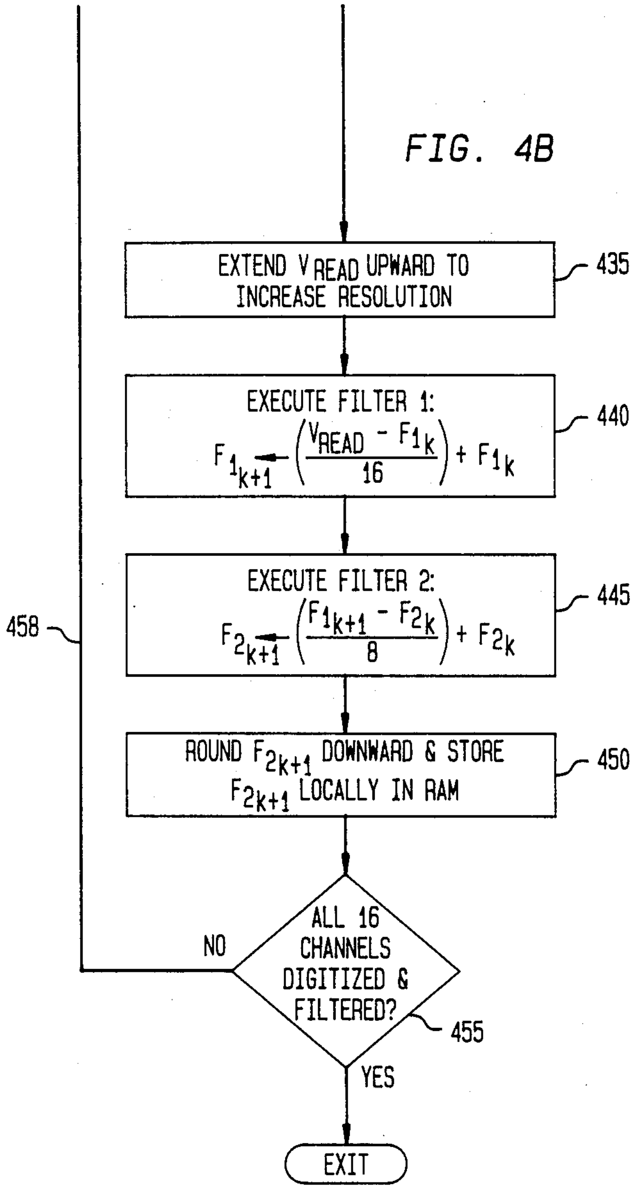

FIGS. 4*a* and 4*b* collectively depict a detailed flowchart of Read and Filter Process Signal Routine 330, shown in FIGS. 3*a* and 3*b*—for which the proper alignment of the respective drawing sheets for FIGS. 4*a* and 4*b* is shown in FIG. 4. For a full understanding of the operation of this routine, the reader should again simultaneously refer to FIG. 6 and particularly to the operations in the segment designated by numeral 640.

Upon entry into routine 330, execution proceeds to block 410. This block initializes the channel counter, m, to zero. Thereafter, control passes to block 412 to start an A/D conversion for channel 0. Once this has occurred, control passes to decision block 415 which ascertains whether A/D converter 130 (see FIGS. 2*a*–2*c*) has finished the conversion. If an end of conversion (EOC) has not yet occurred, then control iterates via the "NO" path back to this decision block. Alternatively, if an end of conversion has occurred, then block 420 is executed. This block, when executed, reads the converted process signal for channel m from the A/D converter as value $V_{read}$ and stores this value in RAM memory. Thereafter, execution proceeds to block 425 which increments the value of the channel counter by one. Once this has occurred, control passes to block 430 which instructs the multiplexer to read channel m+1 and the A/D converter to initiate a conversion for the measured analog voltage produced by this channel.

While the A/D converter is converting this analog voltage, as discussed above, the previously converted value now stored as value $V_{read}$ is filtered. In particular, execution first passes to block 435. This block increases the resolution of value $V_{read}$ to obtain fractional bits and thereby reduce quantization noise. To simplify processing, integer arithmetic is used, and the output of the A/D converter is merely a 12 bit number equivalent to the number of counts between 0 to 4095, inclusive, that corresponds to the fraction of the full scale useable input voltage range represented by the actual analog signal applied to the A/D converter. To increase the resolution of $V_{read}$, a double precision word is formed with the original value of $V_{read}$ inserted into the lower byte of that word. This value is then shifted upward by a pre-selected number of bits, generally ½ word, to occupy intermediate bit locations in the double precision word. The additional bits, now available to the right of the least significant bit of the original value for $V_{read}$, are used to approximate fractional bits occurring during the filtering calculations. The value of these additional low order bits are initially set to zero. As discussed below, these bits are suitably rounded after these filter calculations have been completed.

Thereafter, blocks 440 and 445 are executed. These blocks provide a two pole backward difference low pass filter. In particular, block 440 calculates the following equation to implement a low pass filter, using the value of $V_{read}$ stored in RAM memory:

$$F_{1k+1} = \frac{1}{16}(V_{read} - F_{1k}) + F_{1k}$$

where:

$F_1$ is the output value of this filter for a given iteration k.

Block 445 is then executed to calculate the second filter pole, as given by the following equation:

$$F_{2k+1} = \frac{1}{8}(F_{1k+1} - F_{2k}) + F_{2k}$$

where:

$F_2$ is the output value of this filter for iteration k.

Calculating both filter equations in the form shown above, i.e. by using addition as the final step in each equation, advantageously ensures that, through extended precision integer arithmetic, the output of each filter is very smooth. In particular, as a steady state condition approaches, i.e. when the value of the input applied to each filter (e.g. $V_{read}$) approaches the corresponding filter output value (e.g. $F_{1k+1}$), the duty cycle of the least significant bits in the output begins to closely follow that of the input value. Once the output value, $F_2$, of the second filter has been calculated, it is rounded downward to a single word precision by execution of block 450. In this manner, the duty cycle of the least significant bit of the filter output advantageously tracks that of $V_{read}$.

At this point, execution proceeds to decision block 455 which determines whether the process signals for all sixteen channels have been digitized and filtered. If not, execution loops, via "NO" path 458, to decision block 415 for the next channel. Alternatively, if all sixteen channels have handled, execution exists from this routine.

Figure 2B:
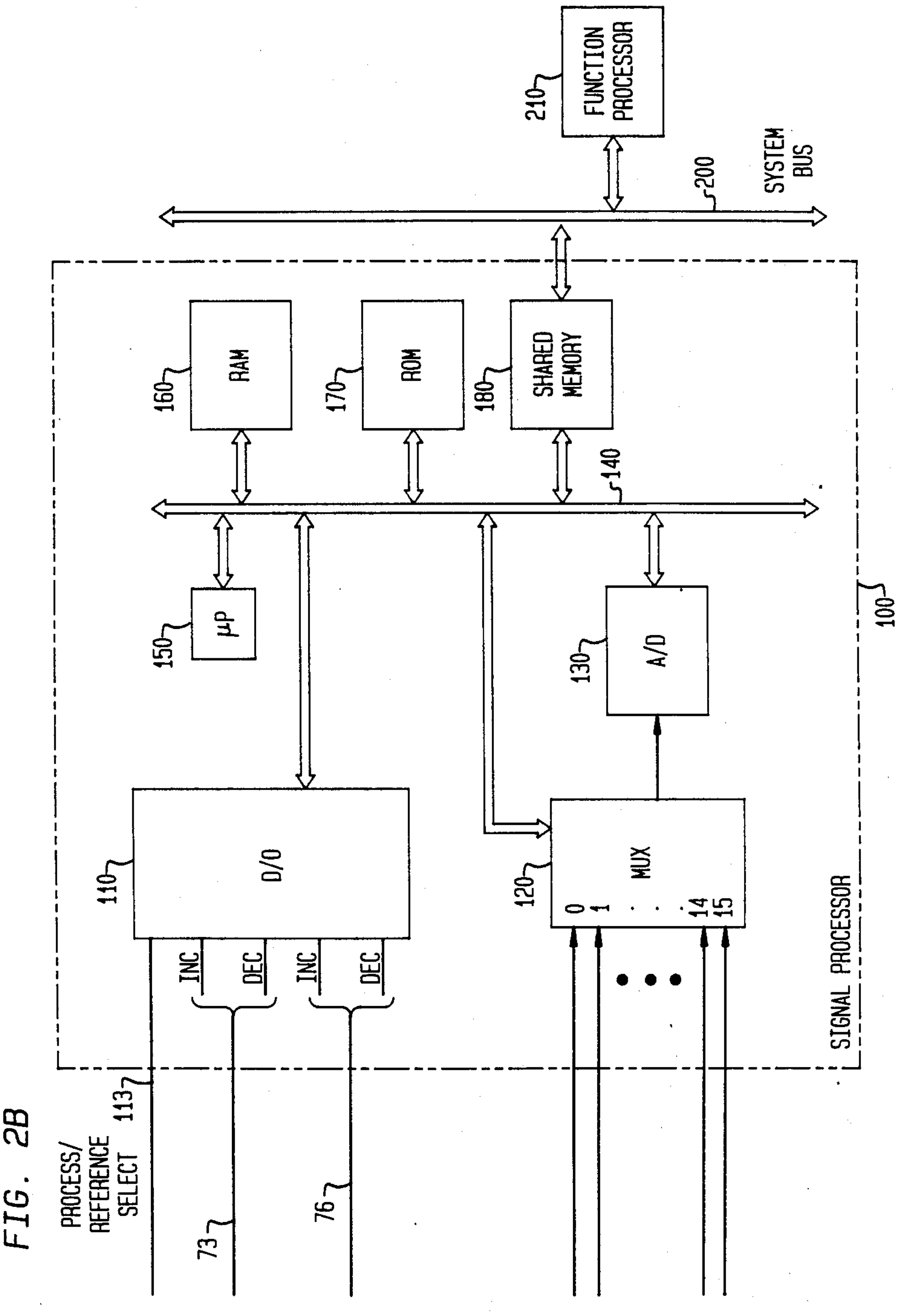
Figure 2C:
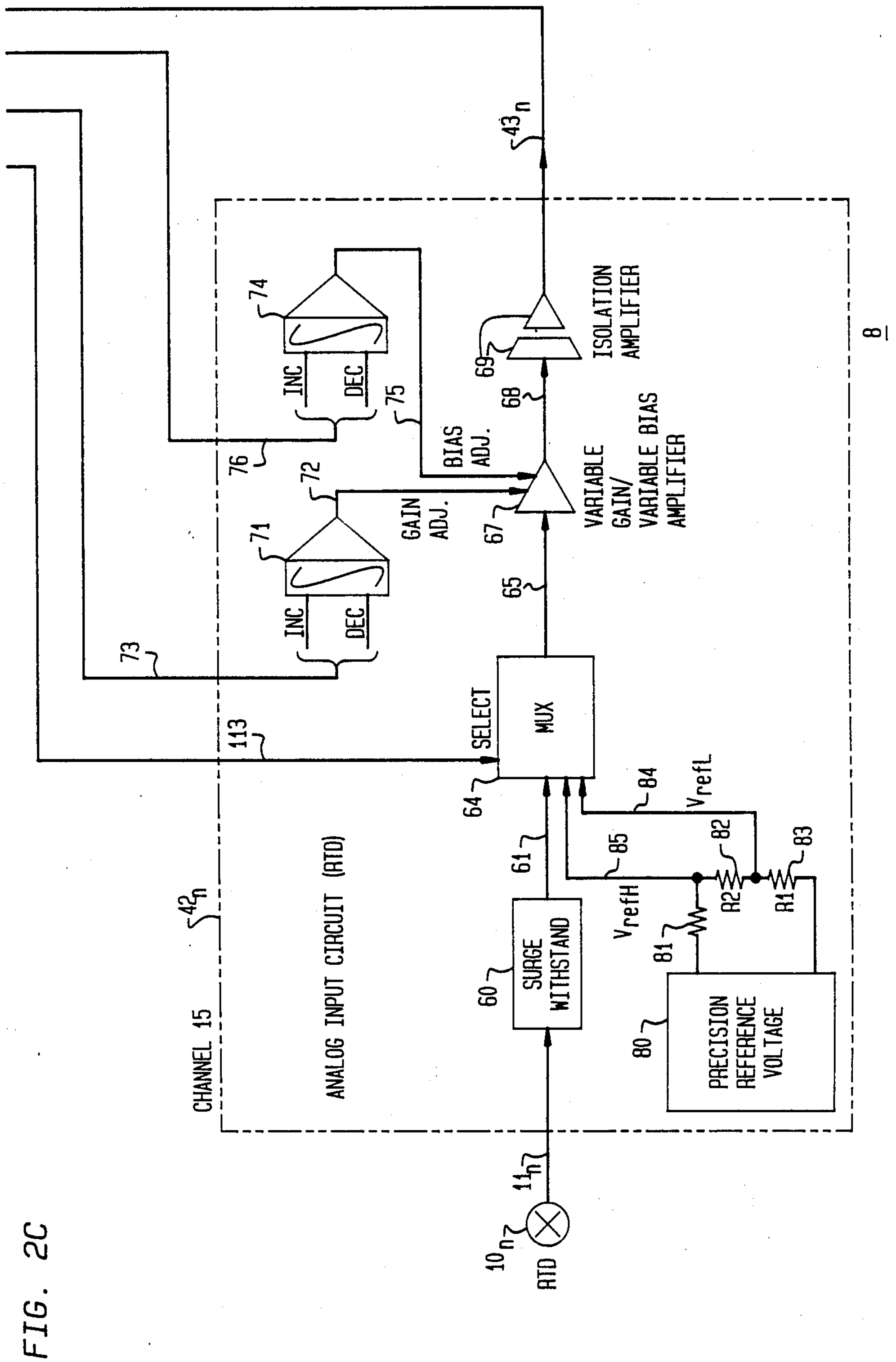
Figure 5B:
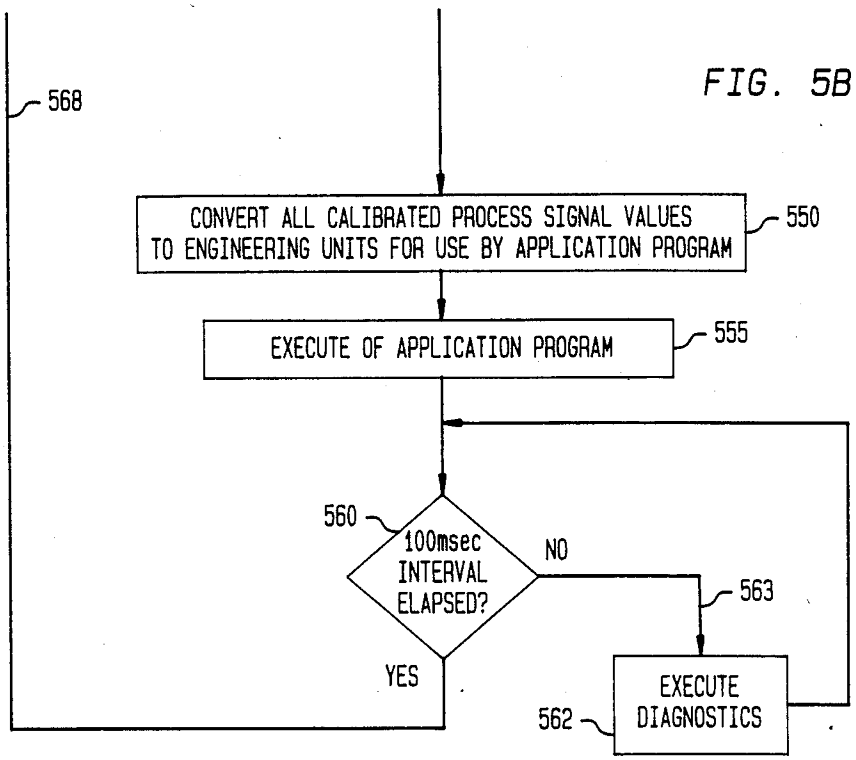

A flowchart of the software executed by function processor 210, shown in FIGS. 2*a*–2*c*, is depicted in FIGS. 5*a* and 5*b*—for which the proper alignment of the drawing sheets is given in FIG. 5. As discussed, the function processor models each analog input circuit using a linear model. Using the filtered reference signal voltages, the function processor calculates gain and bias error coefficients for use in this model and thereafter, through this model, compensates the filtered values for gain and bias errors to produce calibrated values for use in subsequent process control calculations.

When power is first applied to the function processor, control first passes to block 510. Here, various power on diagnostics, such as memory checks, are executed. Thereafter, control passes to initialization block 515 which, among initializing various values, sets channel counter j to zero. Thereafter, control proceeds to block 520. This block, when executed, transfers the latest set of filtered process and reference voltage values from shared memory 180 (see FIGS. 2*a*–2*c*) into local storage within the function processor. Thereafter, execution proceeds to block 525. This block calculates the gain and bias values associated with each analog input circuit given the actual filtered reference voltage values (AV) and the expected value (EV) of each. This block models each analog input circuit as a linear amplifier having an output that has bias and gain. In particular, the gain value, $G_j$, for channel, j, is given by the following equation:

$$G_j = \frac{AV_{(j,refH)} - AV_{(j,refL)}}{EV_{(j,refH)} - EV_{(j,refL)}}$$

where:

$AV_{(j,refH)}$ and $AV_{(j,refL)}$ are the actual filtered values for the reference voltages, $V_{refH}$ and $V_{refL}$, produced by channel j; and $EV_{(j,refH)}$ and $EV_{(j,refL)}$ are the expected values of the filtered reference voltages, $V_{refH}$ and $V_{refL}$, for channel j.

The bias value, $B_j$, for channel j, as is given by:

$$B_j = AV_{(j,refL)} - G_j \cdot EV_{(j,refL)}$$

The actual gain and bias values are used as coefficients in the linear model. In particular, once these gain and bias values are calculated, execution block 530 is executed several tests on the gain and bias values to verify that the hardware in the signal processor functions properly. If any of the tests shown in block 530 fail, the function processor sets an appropriate flag and provides a suitable indication to the operator.

Now, having determined the calculated gain and bias errors, execution proceeds to block 535 which inverts the model to compensate the filtered process signal using these gain and bias values and thereby produce a calibrated value for this signal, as given by the following equation:

$$CV_{(j,p)} = \frac{1}{G_j} * (AV_{(j,p)} - B_j)$$

where:

$CV_{(j,p)}$ is the calibrated value of the filtered process signal for channel j, and $AV_{(j,p)}$ is the actual filtered process signal for channel j.

Once the process signal has been calibrated, execution passes to block 540 to increment the channel counter, j. Thereafter, decision block 545 determines whether the process signals obtained from all sixteen channels have been compensated. If not, execution is routed, via "NO" path 548 to block 525 to repeat the process for the next channel. Alternatively, if all sixteen channels have been compensated, then control passes, via the "YES" path, to block 550. This block, when executed, converts all the calibrated process signals from values in counts to values in engineering units for appropriate use by the application (control) program, e.g. the PID controller previously noted above, represented by block 555. Thereafter, the entire application program is executed as represented by block 555. The function processor updates all its values on a 10 Hz basis. Hence, the loop time through one iteration of the software shown in FIGS. 5*a* and 5*b* is set at 100 milliseconds, as indicated within section 610 of FIG. 6. Decision block 560, shown in FIGS. 5*a* and 5*b*, determines whether this interval has elapsed. If this interval has not elapsed, execution passes, via "NO" path 563, to block 562 to execute diagnostics within the function processor until this time period has elapsed. Once this time period has elapsed, execution proceeds, via "YES" path 568, to block 520 to obtain the next set of calibrated process signal values.

Although the model of each analog input circuit was described above as being linear, this model could alternatively be non-linear, e.g. exponential or parabolic, if necessary. In order to fit a non-linear model to measured data, often three or more measured data points are necessary. Therefore, if a non-linear model were to be used for an analog input circuit, the response of that analog input circuit to three or more different reference voltage values would be taken and thereafter used by the function processor to calculate the coefficients of the specific equation in the model. The model equation would then be inverted, and the calculated coefficients would then be substituted into the equation along with a value of a filtered measured process signal, obtained through that analog input circuit, in order to calculate the corresponding calibrated value for that process signal.

Clearly, those skilled in the art will readily appreciate that although a single embodiment of the present invention has been shown and described herein, this embodiment merely illustrates the principles of the present invention. Many other embodiments incorporating these principles may be readily constructed by those skilled in the art.

What is claimed is:

1. Apparatus for an analog signal processing system comprising:

an analog input circuit having means for controllably selecting an incoming process signal or at least one reference voltage as an input voltage;

means for sampling said input voltage to obtain a sampled value and for producing a digital signal equivalent to said sampled value;

means for digitally filtering said sampled value to yield an actual filtered value of said process signal and a separate actual filtered value of said reference voltage;

means, responsive to said actual filtered reference voltage value and to an expected value of said filtered reference voltage, for calculating at least one coefficient appearing in a pre-defined model of said analog input circuitry to determine an error component injected by said analog input circuitry and existing in the filtered value of said reference voltage; and means for compensating said actual filtered value of the process signal, in accordance with said model and using said calculated coefficient therein, to yield a calibrated value therefor.

2. The apparatus in claim 1 wherein said selecting means comprises means for controllably selecting between first and second reference voltages such that corresponding actual filtered values for said first and second reference voltages are generated by said calculating means.

3. The apparatus in claim 2 wherein said calculating means comprises means, responsive to said actual filtered values for said first and second reference voltages and to expected values therefor, for linearly estimating gain and bias values of said analog input circuit, wherein said gain value is estimated as the ratio of the difference between the actual filtered values for both of said reference voltages to the difference between the expected filtered values for both of said reference voltages, and said bias value is estimated as the actual filtered value of one of said reference voltages less that gain value times the expected filtered value for said one of the reference voltages.

4. The apparatus in claim 3 wherein said analog input circuit comprises means, connected between said selecting means and said sampling and producing means, for varying the gain and bias of said analog input circuit in response to difference between actual filtered values and expected values of said reference voltages produced by said analog input circuit to ensure that subsequently occurring reference voltages produced by said analog input circuit remain within pre-selected ranges.

5. The apparatus in claim 3 wherein said filtering means comprises means for forming an extended precision digital word in which input data to be processed by said filter occupies contiguous intermediate locations in said word thereby decreasing quantization noise generated during said filtering.

6. The apparatus in claim 3 further comprising means for testing each of said gain and bias values to verify the integrity of said system.

7. The apparatus in claim 6 wherein the sampling and producing means comprises means for sequentially selecting each one of a plurality of input voltages produced by a corresponding plurality of analog input circuits.

8. The apparatus in claim 7 wherein the sampling and producing means further comprises means for sequentially sampling all of the incoming process signals from all of said analog input circuits and one of said reference signals from a pre-selected sequential one of said analog input circuits.

9. The apparatus in claim 8 wherein said filtering means digitally filters a present value of said input voltage while said sampling and producing means generates the next successive digital value of said input voltage.

10. The apparatus in claim 9 wherein the magnitudes of the first and second reference voltages applied to said selecting means within any one of said analog input circuits are greater than a maximum expected value of and less than a minimum expected value, respectively, of said process signal applied as input to said one analog input circuit.

11. Apparatus for an analog signal processing system comprising:

an analog input circuit having means for controllably selecting an incoming process signal, a first reference voltage or a second reference voltage as an input voltage;

means for sampling said input voltage to obtain a sampled value and for producing a digital signal equivalent to said sampled value;

means for digitally filtering said sampled value to yield an actual filtered value of said process signal and a separate actual filtered value of each of said first and second reference voltages;

means, responsive to said actual filtered values for said first and second reference voltages and to expected values therefor, for linearly estimating gain and bias values of said analog input circuit, wherein said gain value is estimated as the ratio of the difference between the actual filtered values for both of said reference voltages to the difference between the expected filtered values for both of said reference voltages, and said bias value is estimated as the actual filtered value of one of said reference voltages less that gain value times the expected filtered value for said one of the reference voltages; and means for compensating the actual filtered value of the process signal, in accordance with a pre-defined relationship using said calculated gain and bias values, to yield a calibrated value for said process signal.

12. The apparatus in claim 11 wherein said analog input circuit comprises means, connected between said selecting means and said sampling and producing means, for varying the gain and bias of said analog input circuit in response to difference between actual filtered values and expected values of said reference voltages produced by said analog input circuit to ensure that subsequently occurring reference voltages produced by said analog input circuit remain within pre-selected ranges.

13. The apparatus in claim 11 wherein said filtering means comprises means for forming an extended precision digital word in which input data to be processed by said filter occupies contiguous intermediate locations in said word thereby decreasing quantization noise generated during said filtering.

14. The apparatus in claim 11 further comprising means for testing each of said gain and bias values to verify the integrity of said system.

15. The apparatus in claim 14 wherein the sampling and producing means comprises means for sequentially selecting each one of a plurality of input voltages produced by a corresponding plurality of analog input circuits.

16. The apparatus in claim 15 wherein the sampling and producing means further comprises means for sequentially sampling all of the incoming process signals from all of said analog input circuits and one of said reference signals from a pre-selected sequential one of said analog input circuits.

17. The apparatus in claim 16 wherein said filtering means digitally filters a present value of said input voltage while said sampling and producing means generates the next successive digital value of said input voltage.

18. The apparatus in claim 17 wherein the magnitudes of the first and second reference voltages applied to said selecting means within any one of said analog input circuits are greater than a maximum expected value of and less than a minimum expected value, respectively, of said process signal applied as input to said one analog input circuit.

19. A method for use in an analog signal processing system comprising the steps of:

controllably selecting an incoming process signal or at least one reference voltage to be applied as an input voltage to an analog input circuit;

sampling said input voltage to obtain a sampled value and for producing a digital signal equivalent to said sampled value;

digitally filtering said sampled value to yield an actual filtered value of said process signal and a separate actual filtered value of said reference voltage;

calculating, in response to said actual filtered reference voltage value and to an expected value of said filtered reference voltage, at least one coefficient appearing in a pre-defined model of said analog input circuitry to determine an error component injected by said analog input circuitry and existing in the filtered value of said reference voltage; and compensating said actual filtered value of the process signal, in accordance with said model and using said calculated coefficient therein, to yield a calibrated value therefor.

20. The method in claim 19 wherein said selecting step comprises the step of controllably selecting between first and second reference voltages such that corresponding actual filtered values for said first and second reference voltages are generated by said calculating means.

21. The method in claim 20 wherein the calculating step includes the step of linearly estimating, in response said actual filtered values for said first and second reference voltages and to expected values therefor, gain and bias values of said analog input circuit, wherein said gain value is estimated as the ratio of the difference between the actual filtered values for both of said reference voltages to the difference between the expected filtered values for both of said reference voltages, and said bias value is estimated as the actual filtered value of one of said reference voltages less that gain value times the expected filtered value for said one of the reference voltages.

22. The method in claim 21 further comprising the step of: varying the gain and bias of said analog input circuit in response to differences between actual filtered values and expected values of said reference voltages produced by said analog input circuit to ensure that subsequently occurring reference voltages produced by said analog input circuit remain within pre-selected ranges.

23. The method in claim 21 wherein the filtering step comprises the step of forming an extended precision digital word in which input data to be processed by said filter occupies continguous intermediate locations in said word thereby decreasing quantization noise generated during said filtering.

24. The method in claim 21 further comprising the step of testing each of said gain and bias values to verify the integrity of said system.

25. The method in claim 24 wherein the sampling and producing step further comprises the step of sequentially selecting each one of a plurality of input voltages produced by a corresponding plurality of analog input circuits.

26. The method in claim 25 wherein the sampling and producing step further comprises the step of sequentially sampling all of the incoming process signals from all of said analog input circuits and one of said reference signals from a pre-selected sequential one of said analog input circuits.

27. The method in claim 26 wherein said filtering step further comprises the step of digitally filtering a present value of said input voltage while said sampling and producing step generates the next successive digital value of said input voltage.

* * * * *